United States Patent [19]

Bertoni et al.

[11] 3,840,824

[45] Oct. 8, 1974

[54] ACOUSTIC SURFACE WAVE DEVICE

[75] Inventors: Henry L. Bertoni, Brooklyn, N.Y.; Theodor Tamir, Teaneck, N.J.

[73] Assignee: The United States of America as represented by the Secretary of the Army, Washington, D.C.

[22] Filed: July 20, 1973

[21] Appl. No.: 381,120

[52] U.S. Cl. .................................. 333/30 R, 333/72

[51] Int. Cl. .......................... H03h 9/00, H03h 9/30

[58] Field of Search ............. 333/30 R, 72; 310/8.0, 310/8.1, 8.2, 9.7, 9.8

[56] References Cited

UNITED STATES PATENTS

| | | | |
|---|---|---|---|
| 3,464,033 | 8/1969 | Tournois | 333/30 R |
| 3,534,300 | 10/1970 | Jouffroy et al. | 333/30 R |
| 3,654,500 | 4/1972 | Claiborne | 310/8.3 |
| 3,696,313 | 10/1972 | Adler | 333/30 R |

*Primary Examiner*—James W. Lawrence
*Assistant Examiner*—Marvin Nussbaum
*Attorney, Agent, or Firm*—Edward J. Kelly; Herbert Berl; Daniel D. Sharp

[57] ABSTRACT

A technique is disclosed for substantially improving the efficiency over a broad band of frequencies of a wedge type transducer mounted on a substrate capable of propagating elastic surface waves by interposing a thin coupling layer of appropriate material and thickness between the wedge and the substrate. The layer serves to control the effect of the wedge on the propagation characteristics of the surface wave and thereby matches the characteristics of the resulting wave to the bulk wave transducer that is employed as a component part of the wedge transducer.

11 Claims, 2 Drawing Figures

ACOUSTIC SURFACE WAVE DEVICE

BACKGROUND OF THE INVENTION

A wedge transducer, used either for the reciprocal functions of exciting and detecting Rayleigh or other elastic surface waves propagating on the surface of a substrate, is composed of a bulk wave transducer disposed on the slant face of a wedge whose opposite face is in contact, either directly or through the presence of a layer of a different material, with a substrate. When operating as a surface-wave exciter, an appropriate electrical signal is applied to the bulk wave transducer so as to generate longitudinal or shear bulk elastic waves that propagate through the wedge to the interface of the opposite face of the wedge with the substrate, thus giving rise to a surface wave that propagates along the surface of the substrate. The sole previous design criterion for the wedge transducer has been to choose the wedge angle such that the fields of the incident beam are phase matched to the elastic surface wave excited along the substrate. No consideration, however, has been given to the perturbation of the elastic surface wave resulting from the bonding of the wedge to the substrate; consequently, the efficiency of current wedge transducers is low.

SUMMARY OF THE INVENTION

In accordance with the invention, the efficiency of coupling between the elastic wave beam and the elastic surface wave traveling along the surface of a substrate is greatly increased by a thin layer of appropriate material and thickness positioned between the wedge and the substrate. The purpose of the layer is to mechanically decouple the wedge from the substrate. This decoupling permits control of the perturbation of the elastic surface wave owing to the presence of the wedge. The coupling of the elastically slow wedge material to the substrate perturbs the propagation constant of the surface wave, thus affecting the wedge angle $\theta$ needed for phase matching. In addition, the energy of the elastic surface wave is caused to leak into the wedge, provided that the velocity of the elastic waves in the wedge material is sufficiently slow compared to the velocity of the surface wave in the substrate. Furthermore, if the surface wave is weakly coupled through the layer, then the surface wave will leak a fraction of the energy into the wedge material as it propagates an incremental distance. As a result, the fields of this wave, called a leaky surface wave, or leaky wave, will decay exponentially in the direction of propagation along the interface with an attenuation constant $\alpha$.

In the presence of weak coupling between the surface wave and the wedge, the phase constant $\beta$ of the leaky surface wave will be larger than the shear wave-number of the substrate, so that the leaky wave fields decay into the substrate. For strong coupling, which can occur when the wedge is bonded directly to the substrate, the attenuation constant would be large and the phase constant $\beta$ might be even less than the shear wave-number of the substrate, thus causing unwanted leakage into the substrate.

When the wedge transducer is operating as an exciter of surface waves, the bulk wave beam generated in the wedge by the bulk wave transducer is incident on the substrate at the angle $\theta$ from the normal to the surface of the substrate. If $\theta$ is equal to $\sin^{-1}(\beta/k)$, where $k$ is the wave-number of the leaky wave fields in the wedge, then phase matching of the beam fields with the leaky surface wave is achieved and the leaky surface wave is strongly excited. Initially, the leaky wave re-radiates into the wedge. However, as it propagates past the corner of the wedge, no further leakage can occur and the leaky-wave energy in the substrate is trapped in the form of a bound surface wave.

The trapped surface wave energy is maximized by properly locating the position of the incident beam relative to the corner of the wedge, and by properly selecting the material for, and the thickness of, the coupling layer to achieve the proper value of the leaky wave attenuation constant relative to the width $w$ of the incident bulk wave beam (the attenuation constant should be such that $(1.3 \cos\theta)/\alpha$ is on the order of $w$). In this way, the layer serves to minimize undesirable leakage into the sub-surface regions of the substrate of bulk elastic wave energy in the wedge transducer that falls on the substrate, as well as to minimize undesirable refraction and reflection of said bulk elastic wave energy from the substrate back into the wedge transducer.

When the wedge transducer is operating as a detector of elastic surface waves, the surface wave as it passes beneath the wedge is converted into the form of leaky surface waves which leak energy into the wedge in the form of a bulk wave propagating at the angle $\theta = \sin^{-1}(\beta/k)$ from the normal to the surface of the substrate, and having effective width on the order of $(1.3 \cos\theta)/\alpha$. Maximum conversion of the surface wave energy into electrical energy at the bulk wave transducer can be achieved by making the wedge angle to also be equal to $\theta$ so that the beam is incident normally on the bulk-wave transducer, and by having the effective width of the beam equal to the width $w$ of the bulk wave transducer where $W$ is the width in the plane of incidence. Thus the use of the coupling layer between the wedge and substrate serves to aid the formation of a bulk wave in the wedge that contains the entire energy of the surface wave in a form that can most efficiently be received by the bulk wave transducer.

The operation of the wedge transducer as either an exciter or as a receiver of elastic surface waves are reciprocal functions that are simultaneously made most efficient by using the same coupling layer.

LAYERS OF COMPLIANT MATERIAL

One class of materials that can be used for the layer between the wedge and substrate to control the mechanical coupling between them, as discussed above, is composed of those materials whose rigidity or shear modulus is several times smaller than that of the substrate. A layer of compliant material can be used to control the coupling between the wedge and substrate since the motion produced at one surface of the layer results in only weak forces at the other surface, unless the layer is very thin compared to the wavelength $\lambda_S$ of bulk shear waves in the layer material. For the wedge transducer to operate most efficiently, the layer thickness will normally be less than $\lambda_S/2$. Plastics, epoxies and indium are examples of compliant materials for use with substrates such as quartz, YAG and steel, and are of importance since they can be made to be self-bonding to the wedge and substrate.

LAYERS WITH EVANESCENT FIELDS

For each substrate material, the use of layers with evanescent fields requires a choice of layer material such that the leaky surface wave fields are exponentially weaker at the top of the layer than they are at the layer-substrate interface. The presence of the wedge on the layer will then cause only small leakage per wavelength, which can be varied by means of the layer thickness.

For the field in the layer to be evanescent, it is necessary for the material of the layer to be such that the velocity of shear waves in it is higher than the velocity of the surface wave on the substrate. Investigations have shown that it is desirable for the mass density $\rho_S$ of the substrate to be greater than the mass density $\rho_L$ of the layer by a factor of two or more so that the substrate fields of the leaky surface wave are similar in form to those of the surface wave to be excited or detected, and so that its propagation constant $\beta$ will be close to the propagation constant of the surface wave.

DETAILED DESCRIPTION OF THE PREFERRED EMBODIMENT

Figure 1:
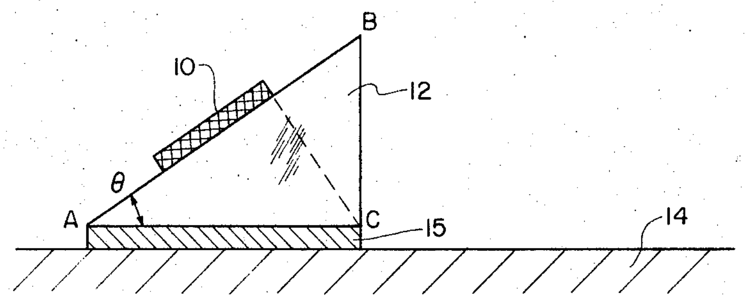
FIGS. 1 and 2 are views illustrating an embodiment of the invention.
Figure 2:
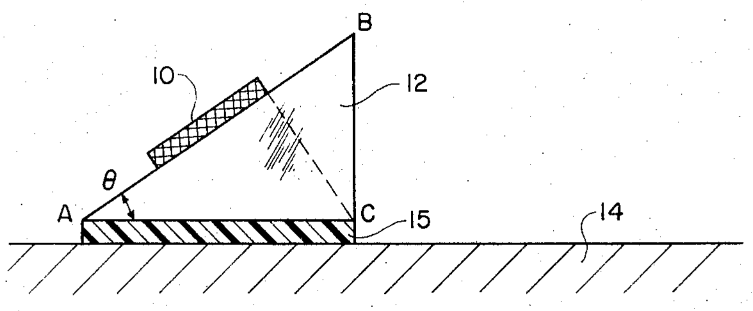

FIGS. 1 and 2 illustrate a bulk (elastic) wave transducer 10 mounted on the slant face AB of an elastically slow wedge 12. The opposite face AC of the wedge makes mechanical contact with a substrate 14 along the surface of which an elastic surface wave propagates. A coupling layer 15 is interposed between the wedge and the substrate 14; this coupling layer, for example, can be of the metal indium, as indicated in FIG. 1, or can be a plastic or epoxy, as indicated in FIG. 2. The characteristics of the coupling layer 15 have been set forth previously. As already explained, the first type of coupling layer is one in which controlled coupling is obtained by using a compliant material. For the second type of layer, the fields decay away from the surface of the substrate, thus providing the necessary weak coupling between the wedge and substrate.

As indicated in FIGS. 1 and 2, the location of the bulk wave transducer on the slant face of the wedge should be such that a line perpendicular to the slant face and passing through the side of the bulk wave transducer nearest the upper corner B of the wedge also fall at or near the lower corner C of the wedge. Also, the angle $\theta$ of the corner A of the wedge, that is, the angle between the substrate and the slant face AB of the wedge, should be equal to $\sin^{-1} (\beta/k)$, where $\beta$ is the phase constant of the leak surface wave and k is the wave-number of the leaky wave fields in the wedge.

We wish it to be understood that we do not desire to be limited to the exact details of procedure shown and described, for obvious modifications will occur to a person skilled in the art.

What is claimed is:

1. A device for coupling an electrical signal and an elastic surface wave propagating along the surface of a substrate comprising a wedge having a slant face and a second face disposed opposite said slant face, a coupling layer interposed only between said second face of said wedge and said substrate, said wedge and said layer altering the configuration of said elastic surface wave over that portion of said substrate juxtaposed with said wedge to form a leaky surface wave having fields that propagate into said wedge, and a bulk wave transducer mounted on said slant face and capable of reciprocal conversion of electrical energy and elastic energy contained in the fields of said leaky surface wave within said wedge.

2. A device as set forth in claim 1 wherein the angle $\theta$ between the slant face of said wedge and the surface of said substrate is given by $$\theta = \sin^{-1} \beta/k$$

where $\beta$ is the phase constant along the substrate of the leaky surface wave in the combined medium consisting of the wedge and juxtaposed layered substrate and $k$ is the wave-number of the leaky wave fields in said wedge.

3. A device according to claim 1 wherein the layer material has a shear modulus small compared with the shear modulus of said substrate.

4. A device according to claim 1 wherein said layer material is an epoxy.

5. A device according to claim 1 wherein said layer material is composed of indium.

6. A device according to claim 1 wherein the velocity of propagation of the elastic shear wave within said layer is slightly greater than the velocity of propagation of the elastic shear wave in said substrate, and wherein the ratio of the mass density $\rho_L$ of said layer and the mass density $\rho_S$ of said substrate satisfies the relation $$\rho_L/\rho_S < 1/2.$$

7. A device according to claim 1 wherein the width $w$ of the bulk wave transducer in the plane of incidence is given substantially by the relation $$w = 1.3 \cos \theta/\alpha$$

where $\alpha$ is the attenuation constant of the bulk wave in the combined three-layer medium $\beta'$.

8. A device according to claim 2 wherein the layer material has a shear modulus small compared with the shear modulus of said substrate.

9. A device according to claim 2 wherein said layer material is an epoxy.

10. A device according to claim 2 wherein said layer material is composed of indium.

11. A device according to claim 2 wherein the velocity of propagation of the elastic shear wave within said layer is slightly greater than the velocity of propagation of the elastic shear wave in said substrate, and wherein the ratio of the mass density $\rho_L$ of said layer and the mass density $\rho_S$ of said substrate satisfies the relation $$\rho_L/\rho_S < 1/2.$$

* * * * *